United States Patent
Takeuchi et al.

(10) Patent No.: US 11,476,224 B2
(45) Date of Patent: Oct. 18, 2022

(54) WIRING MEMBER AND SEMICONDUCTOR MODULE INCLUDING SAME

(71) Applicant: Mitsubishi Electric Corporation, Tokyo (JP)

(72) Inventors: Kensuke Takeuchi, Tokyo (JP); Takashi Nagao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 64 days.

(21) Appl. No.: 16/975,189

(22) PCT Filed: May 8, 2018

(86) PCT No.: PCT/JP2018/017730
§ 371 (c)(1),
(2) Date: Aug. 24, 2020

(87) PCT Pub. No.: WO2019/215806
PCT Pub. Date: Nov. 14, 2019

(65) Prior Publication Data
US 2020/0395329 A1  Dec. 17, 2020

(51) Int. Cl.
*H01L 23/00* (2006.01)
*H01L 23/495* (2006.01)

(52) U.S. Cl.
CPC .......... *H01L 24/40* (2013.01); *H01L 23/4952* (2013.01); *H01L 23/49524* (2013.01);
(Continued)

(58) Field of Classification Search
CPC ............... H01L 24/37; H01L 24/48; H01L 2224/40245; H01L 2224/48247
See application file for complete search history.

(56) References Cited

U.S. PATENT DOCUMENTS

2008/0150102 A1  6/2008  Yokomae et al.
2012/0106058 A1*  5/2012  Chin .................. H05K 7/1467
                                                                    361/679.02
(Continued)

FOREIGN PATENT DOCUMENTS

DE  102007049481 A1  4/2008
DE  202014003171 U1  5/2014
(Continued)

OTHER PUBLICATIONS

Communication dated Oct. 5, 2021, issued by the Japanese Patent Office in application No. 2020-517650.
(Continued)

*Primary Examiner* — Robert G Bachner
(74) *Attorney, Agent, or Firm* — Sughrue Mion, PLLC; Richard C. Turner

(57) ABSTRACT

In a wiring member, an element connection portion, a plate connection portion, and an upper surface portion are at height positions different from one another. The element connection portion has a through hole, and the plate connection portion has a through hole and a chamfer. The upper surface portion which is not connected to another portion, has projections asymmetrically disposed on both side surfaces thereof. Owing to these features, the type, the orientation, and the front and the back of the wiring member can be easily distinguished. Accordingly, it is possible to prevent incorrect assembling of the wiring member in a semiconductor module.

10 Claims, 4 Drawing Sheets

(52) U.S. Cl.
CPC ........ *H01L 23/49537* (2013.01); *H01L 24/37* (2013.01); *H01L 24/48* (2013.01); *H01L 2224/40245* (2013.01); *H01L 2224/48247* (2013.01)

(56) References Cited

U.S. PATENT DOCUMENTS

| | | |
|---|---|---|
| 2013/0307129 A1 | 11/2013 | Fujita et al. |
| 2015/0076570 A1 | 3/2015 | Sunaga et al. |
| 2016/0181221 A1 | 6/2016 | Sunaga et al. |

FOREIGN PATENT DOCUMENTS

| | | |
|---|---|---|
| EP | 3024024 A1 | 5/2016 |
| JP | 59-010244 A | 1/1984 |
| JP | 63-055537 U | 4/1988 |
| JP | 05-299566 A | 11/1993 |
| JP | 2003-318344 A | 11/2003 |
| JP | 2003-332393 A | 11/2003 |
| JP | 2008205100 A | 9/2008 |
| JP | 2011-204886 A | 10/2011 |
| JP | 2013-187511 A | 9/2013 |
| JP | 5569555 B2 | 8/2014 |
| WO | 2013/179638 A1 | 12/2013 |

OTHER PUBLICATIONS

International Search Report of PCT/JP2018/017730 dated Aug. 7, 2018 [PCT/ISA/210].
Communication dated Mar. 9, 2021, from the European Patent Office in application No. 18918204.1.

\* cited by examiner

WIRING MEMBER AND SEMICONDUCTOR MODULE INCLUDING SAME

CROSS REFERENCE TO RELATED APPLICATIONS

This application is a National Stage of International Application No. PCT/JP2018/017730, filed May 8, 2018.

TECHNICAL FIELD

The present disclosure relates to a wiring member and a semiconductor module including the same.

BACKGROUND ART

Conventionally, in semiconductor modules, connection has been made between semiconductor elements or between, for example, a semiconductor element and a plate by means of wiring members such as wires and clips. In addition, Patent Document 1 discloses, as a wiring member for electrically connecting three portions to each other, a three-dimensional wiring member in which a first leg portion, a second leg portion, and a third leg portion respectively connected to a first conduction portion, a second conduction portion, and a third conduction portion, a first joining portion for joining the first leg portion and the second leg portion together, and a second joining portion for joining the second leg portion and the third leg portion together, are integrated with each other.

In this conventional technology, since the first leg portion, the second leg portion, and the third leg portion are arranged non-linearly, connection portions at the three portions form a triangle, whereby the three conduction portions are assuredly connected to each other by means of the one wiring member. In addition, since connections are made at the three points, a defect in which the wiring member falls is inhibited from occurring.

CITATION LIST

Patent Document

Patent Document 1: Japanese Patent No. 5569555

SUMMARY OF THE INVENTION

Problems to be Solved by the Invention

In circuits included in semiconductor modules, a plurality of wiring members having shapes that are similar to or the same as one another may be used. Therefore, the type, the orientation, and the back and the front of each wiring member need to be distinguished in a step of mounting the wiring members, resulting in reduction in operation efficiency. In addition, similar wiring members are sometimes difficult to be distinguished from one another also in an automated line capable of detecting wiring members by using a camera, whereby a problem arises in that the wiring members are assembled such that the type, the orientation, or the front and the back of any of the wiring members are incorrect. For the wiring member disclosed in Patent Document 1, no measure has been taken to distinguish a plurality of similar wiring members from one another.

The present disclosure has been made to solve the above problems, and an object of the present disclosure is to enable easy distinguishment of the type, the orientation, and the front and the back of a wiring member, thereby preventing incorrect assembling of the wiring member in a semiconductor module.

Solution to the Problems

A wiring member according to the present disclosure is a wiring member for electrically connecting at least a first conduction portion and a second conduction portion to each other, the wiring member including: a first connection portion to be connected to the first conduction portion; a second connection portion to be connected to the second conduction portion; an upper surface portion disposed between the first connection portion and the second connection portion; and a leg portion disposed at each of a portion between the upper surface portion and the first connection portion and a portion between the upper surface portion and the second connection portion, wherein the first connection portion, the second connection portion, the upper surface portion, and the leg portions are integrated with each other, and the upper surface portion has either or both of a projection and a recess.

A semiconductor module according to the present disclosure includes: the wiring member according to the present disclosure; a plurality of semiconductor elements; and a plate which is made of metal and on which the semiconductor elements are mounted, wherein the first conduction portion is each semiconductor element, and the second conduction portion is the plate.

Effect of the Invention

In the wiring member according to the present disclosure, the type, the orientation, and the front and the back of the wiring member can be easily distinguished by providing either or both of the projection and the recess to the upper surface portion. Accordingly, it is possible to prevent incorrect assembling of the wiring member in the semiconductor module. In addition, since the upper surface portion is a portion that is not connected to another portion, the degree of freedom in design regarding the sizes and the positions of the projection and the recess is high.

Objects, features, viewpoints, and effects of the present disclosure other than the above-described ones will be more clarified from the following detailed description with reference to the drawings.

DESCRIPTION OF EMBODIMENTS

Embodiment 1

Figure 1:
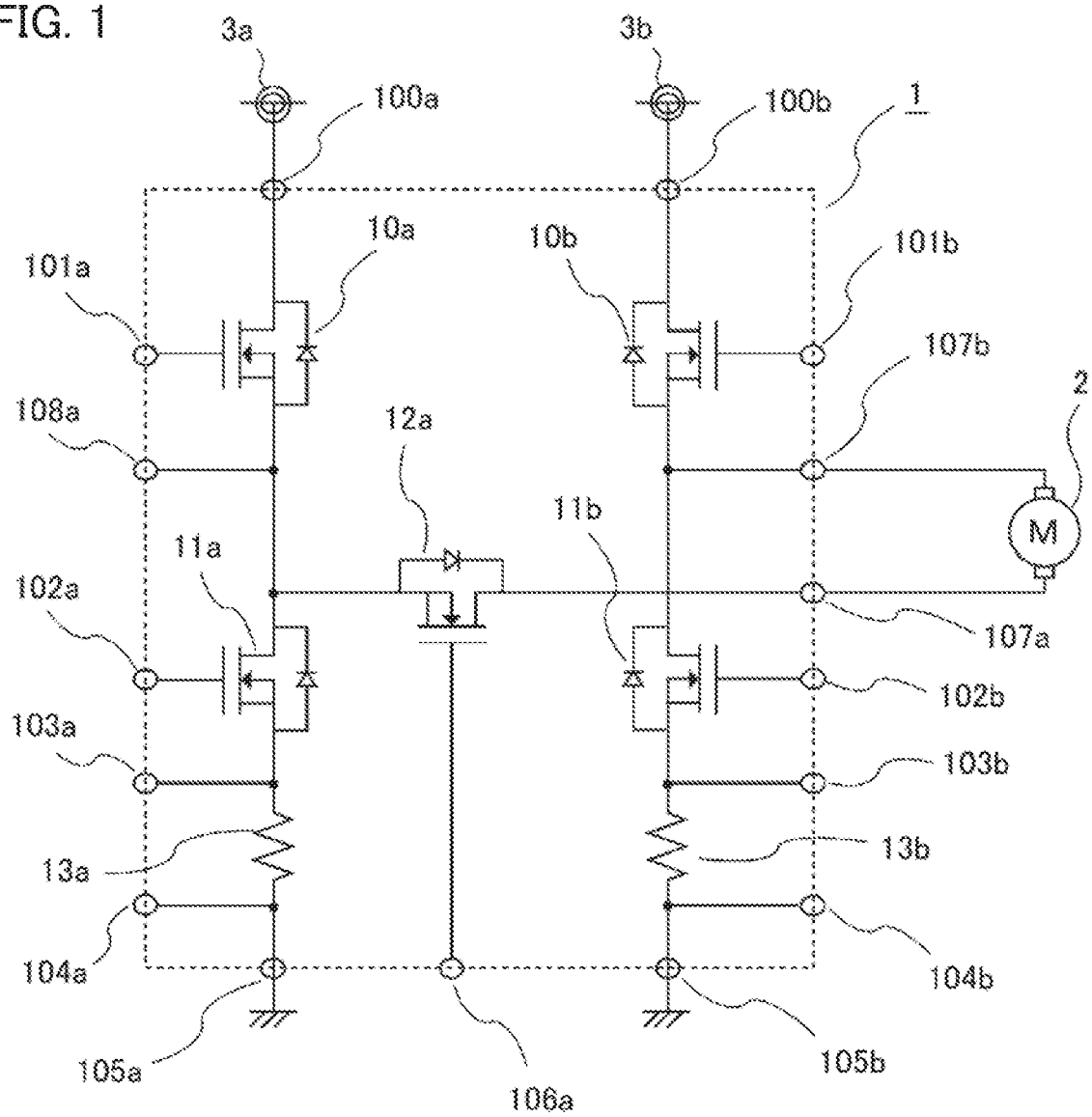
FIG. 1 is a diagram showing a circuit configuration of a semiconductor module according to embodiment 1.
Figure 2:
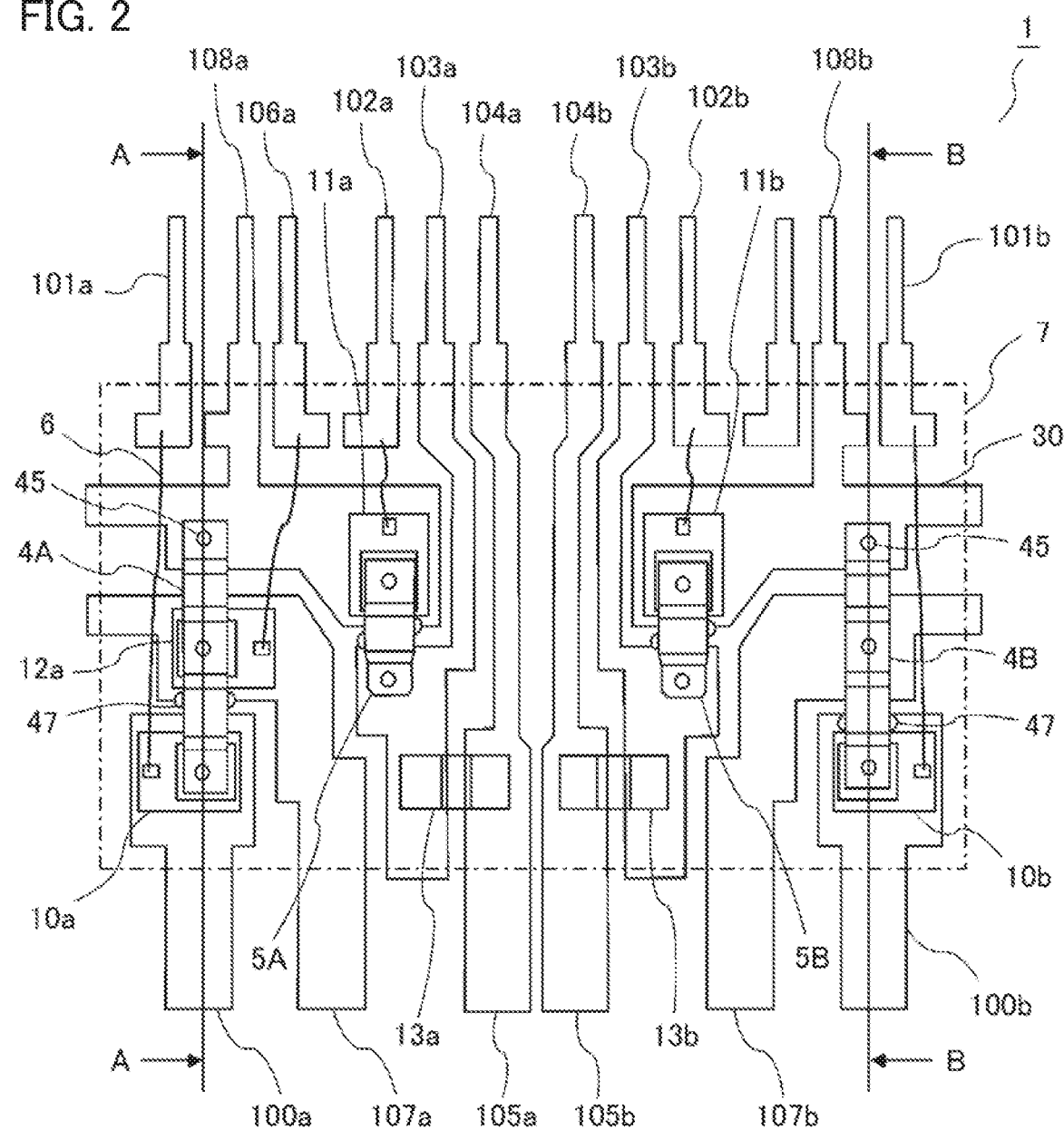
FIG. 2 is a diagram showing an internal structure of the semiconductor module according to embodiment 1.

Hereinafter, a semiconductor module according to embodiment 1 will be described with reference to the drawings. FIG. 1 is a diagram showing a circuit configuration of the semiconductor module according to embodiment 1. FIG. 2 is a top view in which an internal structure of the semiconductor module according to embodiment 1 is shown so as to be seen through. In the drawings, identical and corresponding parts are denoted by the same reference characters. A semiconductor module 1 according to embodiment 1 includes therein two phases of bridge circuits for driving a motor (so-called H-bridge circuit).

A circuit configuration of the semiconductor module 1 according to embodiment 1 will be described with reference to FIG. 1. In FIG. 1, the circles (100a, 100b, and the like) indicate terminals of the semiconductor module 1. In the H-bridge circuit, from terminals 100a and 100b connected to power supplies 3a and 3b, connections are made to switching elements 10a and 10b on the high-potential side and switching elements 11a and 11b on the low-potential side, and connections are made further downstream to terminals 105a and 105b as ground terminals via shunt resistors 13a and 13b. As the switching elements 10a, 10b, 11a, and 11b, for example, semiconductor elements such as FETs (field effect transistors) are used.

In FIG. 1, in the left-side bridge circuit, a switching element 12a functioning as a relay is disposed on a line extending from an intermediate point between the switching element 10a and the switching element 11a, and is connected to a terminal 107a for output to the motor. The terminal 108a is a connection point between the three switching elements 10a, 11a, and 12a. The voltage of the terminal 108a is monitored, whereby failures of the switching elements 10a, 11a, and 12a can be detected. Meanwhile, the right-side bridge circuit does not have any switching element functioning as a relay, and a line extending from an intermediate point between the switching element 10b and the switching element 11b is connected to a terminal 107b for output to the motor.

The gates of the switching elements 10a and 10b on the high-potential side are connected to terminals 101a and 101b for gate signals. Likewise, the gates of the switching elements 11a and 11b on the low-potential side are connected to terminals 102a and 102b, and the gate of the switching element 12a functioning as a relay is connected to a terminal 106a. Terminals 103a and 104a are terminals for detecting the potential difference between both ends of the shunt resistor 13a. Likewise, terminals 103b and 104b are terminals for detecting the potential difference between both ends of the shunt resistor 13b.

An internal structure of the semiconductor module 1 including the above circuits will be described with reference to FIG. 2. In FIG. 2, the alternate long and short dash line indicates a region covered with a mold resin 7. In the semiconductor module 1 in FIG. 2, the plurality of terminals extend in the up-down direction, control terminals for receiving and outputting control signals are arranged on the upper side, and power terminals into which large current is to flow are arranged on the lower side. The terminals are formed by plates 30 on which the switching elements are mounted. Each plate 30 is a conductive plate that is made of a metal having a minimal electric resistance, such as copper or a copper alloy.

The left-side bridge circuit in FIG. 2 will be described. The switching element 10a on the high-potential side is mounted on a plate 30 at which the terminal 100a as a power supply terminal extends. The switching elements 10a, 11a, and 12a have sources and gates disposed on the upper surfaces thereof and have drains disposed on the bottom surfaces thereof. A wiring member 4A connects three portions which are the source of the switching element 10a, the source of the switching element 12a functioning as a relay, and a plate 30.

The switching element 11a on the low-potential side is mounted on the plate 30 to which the wiring member 4A is connected. A wiring member 5A connects the source of the switching element 11a and a plate 30 to each other. Accordingly, the switching element 11a and one end of the shunt resistor 13a are connected to each other. The other end of the shunt resistor 13a is connected to a plate 30 at which the terminal 105a as a ground terminal extends.

The drain of the switching element 12a is connected to a plate 30 at which the terminal 107a for output to the motor extends. The gates of the switching elements 10a, 11a, and 12a are respectively connected to the terminals 101a, 102a, and 106a for gate control via wire bonds 6. Both ends of the shunt resistor 13a are connected to the terminals 103a and 104a. The terminal 108a is the connection point between the three switching elements 10a, 11a, and 12a.

The right-side bridge circuit in FIG. 2 has a circuit configuration similar to that of the left-side bridge circuit, and thus description of the same parts will be omitted. The right-side bridge circuit does not have any switching element that corresponds to the switching element 12a functioning as a relay. Therefore, the shape of a right-side wiring member 4B is different from that of the left-side wiring member 4A. Meanwhile, the shape of a right-side wiring member 5B is the same as that of the left-side wiring member 5A. The terminal 108b is the connection point between the two switching elements 10b and 11b.

The wiring members 4A, 4B, 5A, and 5B according to embodiment 1 electrically connect at least first conduction portions and second conduction portions to each other, and are formed by plates made of copper, for example. The first conduction portions are, for example, switching elements, and the second conduction portions are, for example, plates. However, the combination of the first conduction portions and the second conduction portions is not limited thereto, and there is also a case where connection is made between the switching elements or between the plates. In a case where three or more portions including a first conduction portion, a second conduction portion, and a third conduction portion are connected to each other, each of the conduction portions may be a switching element or a plate, and the combination thereof may be arbitrarily determined.

Each of the wiring members 4A, 4B, 5A, and 5B includes: a first connection portion to be connected to a first conduction portion; a second connection portion to be connected to a second conduction portion; an upper surface portion disposed between the first connection portion and the second connection portion; and a leg portion disposed at each of a portion between the upper surface portion and the first connection portion and a portion between the upper surface portion and the second connection portion. The first connection portion, the second connection portion, the upper surface portion, and the leg portions are integrated with each other. The upper surface portion has projections, and the first connection portion and the second connection portion have through holes.

Figure 3:
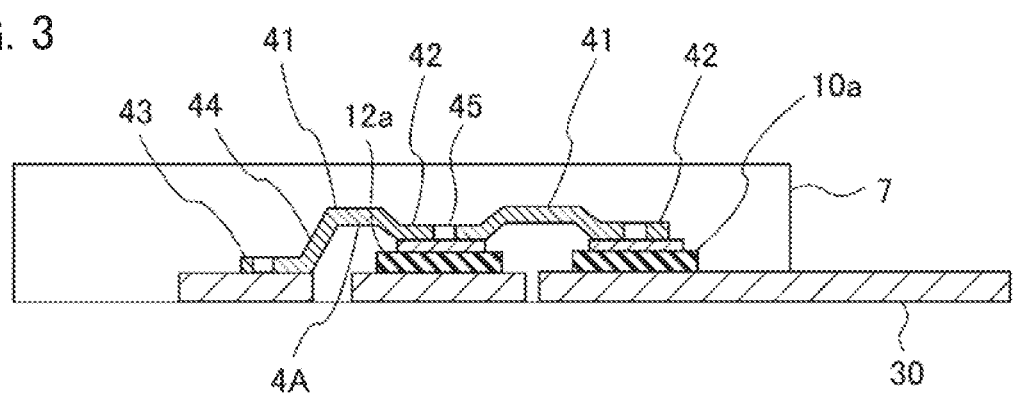
FIG. 3 is a cross-sectional view of a wiring member according to embodiment 1.
Figure 4:
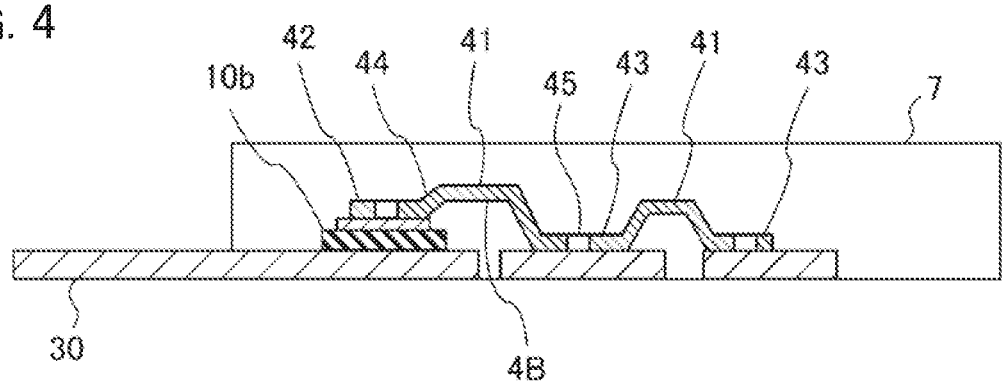
FIG. 4 is a cross-sectional view of another wiring member according to embodiment 1.

The wiring members 4A and 4B will be described in detail with reference to FIG. 3 and FIG. 4. FIG. 3 is a cross-sectional view taken along the line indicated by A-A in FIG. 2. FIG. 4 is a cross-sectional view taken along the line indicated by B-B in FIG. 2. As shown in FIG. 3, the wiring member 4A connects the three portions which are the two switching elements 10a and 12a and the plate 30.

The wiring member 4A includes: two upper surface portions 41; an element connection portion 42 which is the first connection portion connected to the source of the switching element 10a which is the first conduction portion; a plate connection portion 43 which is the second connection portion connected to the plate 30 which is the second conduction portion; and an element connection portion 42 which is a third connection portion connected to the source of the switching element 12a which is a third conduction portion. A leg portion 44 is disposed at each of a portion between one of the upper surface portions 41 and the element connection portion 42 and a portion between the upper surface portion 41 and the plate connection portion 43. The upper surface portions 41, the element connection portions 42, the plate connection portion 43, and the leg portions 44 are integrated with each other.

Meanwhile, the wiring member 4B connects three portions which are one switching element 10b and two plates 30, as shown in FIG. 4. The wiring member 4B includes: two upper surface portions 41; an element connection portion 42 which is the first connection portion connected to the switching element 10b which is the first conduction portion; and two plate connection portions 43 which are the second connection portion and a third connection portion connected to the two plates 30 which are the second conduction portion and a third conduction portion. A leg portion 44 is disposed at each of a portion between one of the upper surface portions 41 and the element connection portion 42 and a portion between the upper surface portion 41 and the corresponding plate connection portion 43. The upper surface portions 41, the element connection portion 42, the plate connection portions 43, and the leg portions 44 are integrated with each other.

In the wiring members 4A and 4B, the upper surface portions 41 project in a direction opposite to a direction toward: a connection surface, with the switching element 10a, of the element connection portion 42; and connection surfaces, with the plates 30, of the plate connection portions 43. The upper surface portions 41 are provided parallel to the element connection portions 42 and the plate connection portions 43. Each element connection portion 42, each plate connection portion 43, and each upper surface portion 41 are at height positions different from one another.

Each element connection portion 42 has a through hole 45 formed in a direction perpendicular to the connection surface with the switching element 10a, 10b, or 12a. Likewise, each plate connection portion 43 has a through hole 45 formed in a direction perpendicular to the connection surface with the corresponding plate 30. Since the through holes 45 are provided, when the wiring members 4A and 4B are connected to the switching elements 10a, 10b, and 12a, or the plates 30 by joining members such as solder, the joining members pass though the through holes 45 to be applied up to the upper surfaces of the wiring members 4A and 4B. Accordingly, connection strength is improved.

In this manner, although the shapes of the wiring members 4A and 4B as seen from above are very similar to each other, cross-sectional shapes of the wiring members 4A and 4B are slightly different from each other. Therefore, the wiring members 4A and 4B have to be distinguished from each other for usage in order to prevent incorrect assembling of both members. Ordinarily, an assembling robot grasps (or sucks) the wiring members 4A and 4B and disposes the wiring members 4A and 4B at predetermined positions, with a view from the top as shown in FIG. 2. Likewise, in the case of assembling with the hands of a person as well, the wiring members 4A and 4B are selected with a view from the top.

In view of this, projections 47 are used for distinguishing the wiring members 4A and 4B from each other with a view from the top.

The wiring members 4A and 4B have the projections 47 integrated with the upper surface portions 41. Each upper surface portion 41 is a portion that is not connected to another portion, and is disposed at the highest position. Thus, the upper surface portion 41 provides an advantage that the degree of freedom in design regarding the sizes and the positions of the projections 47 is high. In addition, no special step is needed for forming the projections 47 on the upper surface portions 41, and the wiring members 4A and 4B having the projections 47 can be produced by cutting conductive plates so as to form the projections 47 simultaneously with the other portions of the wiring members 4A and 4B and bending the conductive plates.

As shown in FIG. 2, the projections 47 of each of the wiring members 4A and 4B are symmetrically provided on both side surfaces of the upper surface portion 41, and there is a difference in the positions of the projections 47 between the wiring member 4A and the wiring member 4B. The wiring member 4A has the projections 47 on the upper surface portion 41 at a portion near the switching element 12 at the center. Meanwhile, the wiring member 4B has the projections 47 on the upper surface portion 41 at a portion near the switching element 10b. Thus, the wiring member 4A and the wiring member 4B can be distinguished from each other based on the difference in the positions of the projections 47.

The wiring members 4A and 4B have lengths equal to or larger than twice the lengths of the wiring members 5A and 5B, and furthermore, each plate connection portion 43, each element connection portion 42, and each upper surface portion 41 are formed at height positions different from one another. Accordingly, the back and the front of each of the wiring members 4A and 4B are easily distinguished. Thus, the wiring members 4A and 4B can be recognized even if they are turned upside down.

Figure 5:
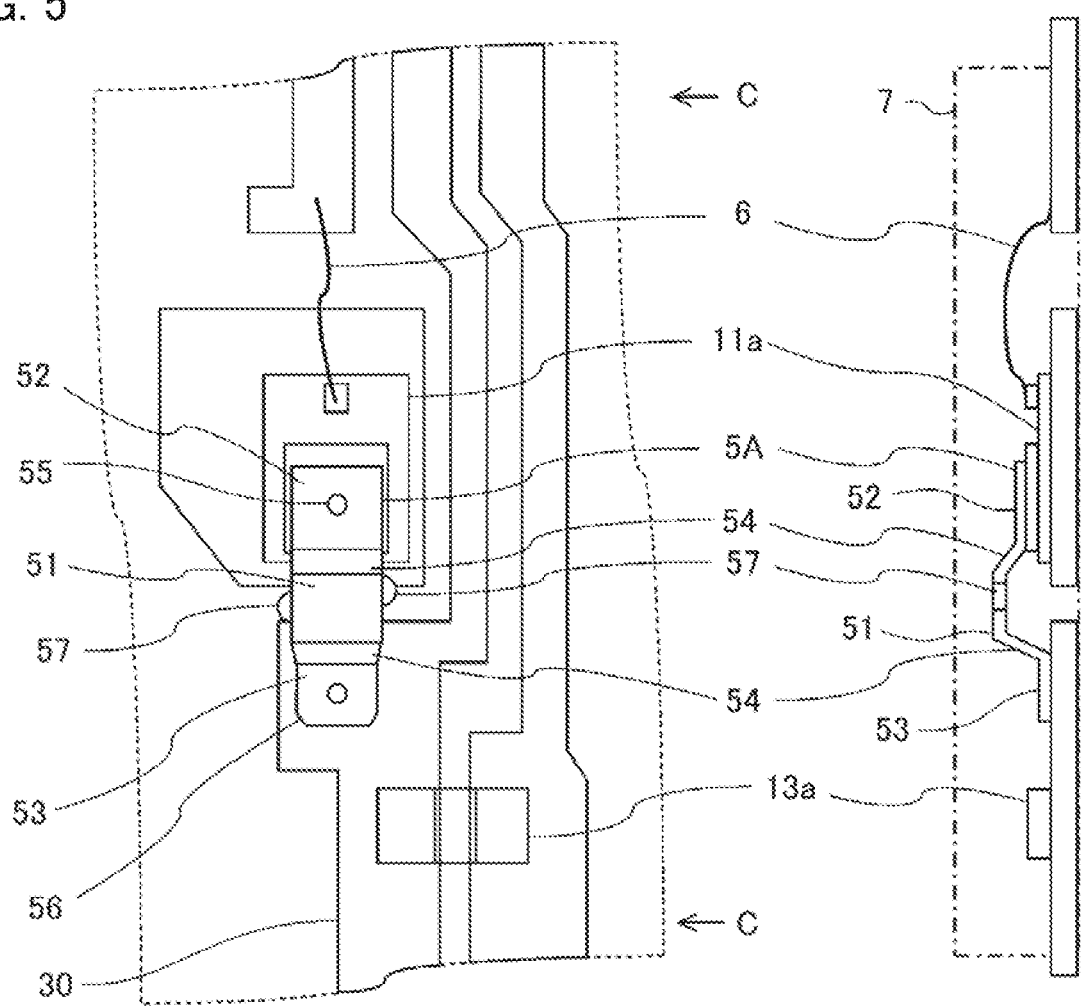
FIG. 5 is a top view and a side view of still another wiring member according to embodiment 1.

Next, the wiring members 5A and 5B will be described in detail with reference to FIG. 5. The right side of FIG. 5 is a side view in which a top view shown on the left side of FIG. 5 is seen in the direction indicated by the arrow C, and the alternate long and short dash line indicates the mold resin 7. The wiring members 5A and 5B have the same shape, and thus only the wiring member 5A is shown in FIG. 5. The wiring member 5A includes: an upper surface portion 51; an element connection portion 52 which is the first connection portion connected to the source of the switching element 11a which is the first conduction portion; and a plate connection portion 53 which is the second connection portion connected to a plate 30 which is the second conduction portion. A leg portion 54 is disposed at each of a portion between the upper surface portion 51 and the element connection portion 52 and a portion between the upper surface portion 51 and the plate connection portion 53. The upper surface portion 51, the element connection portion 52, the plate connection portion 53, and the leg portions 54 are integrated with each other.

In the wiring member 5A, the upper surface portion 51 projects in a direction opposite to a direction toward: a connection surface, with the switching element 11a, of the element connection portion 52; and a connection surface, with the plate 30, of the plate connection portion 53. The upper surface portion 51 is provided parallel to the element connection portion 52 and the plate connection portion 53. The element connection portion 52, the plate connection portion 53, and the upper surface portion 51 are at height positions different from one another. The element connection portion 52 has a through hole 55 formed in a direction perpendicular to the connection surface with the switching element 11a. The plate connection portion 53 has a through hole 55 formed in a direction perpendicular to the connection surface with the plate 30.

Chamfers 56 are formed at corners of the plate connection portion 53. The wiring member 5A is a small-sized component having a width dimension that is smaller than the width dimension of the switching element 11a and that is, for example, about several millimeters. However, if the chamfers 56 can be recognized with a camera or visually, the orientation of the wiring member 5A can be identified based on the chamfers 56. For example, in FIG. 5, the portion having the chamfers 56 can be identified as the plate connection portion 53, and the portion having no chamfer can be identified as the element connection portion 52.

The chamfers 56 are preferably large from the standpoint of visibility. However, if the chamfers 56 are made large, the area of the plate connection portion 53 decreases. Therefore, the chamfers 56 are desirably small from the standpoint of connection strength. The shape of each chamfer 56 is not limited to the linear shape shown in FIG. 5, and may be a curved shape. Further, although the chamfer 56 is formed on each of both corners of the plate connection portion 53 in FIG. 5, the chamfer 56 may be formed on only one of the corners.

Meanwhile, projections 57 asymmetrically provided on both side surfaces of the upper surface portion 51 can be used for distinguishing the front and the back of the wiring member 5A. Since the wiring member 5A is a small component as described above, the front and the back thereof are sometimes reversed, and it is difficult to distinguish the front and the back based only on the chamfers 56. The positions of the two asymmetrically disposed projections 57 are switched with each other if the wiring member 5A is turned upside down. Therefore, the front and the back can be distinguished based on the positions of the two projections 57.

As described above, in each of the wiring members 4A, 4B, 5A, and 5B according to embodiment 1, the projections 47 or 57 are provided to the upper surface portion 41 or 51, whereby the type, the orientation, and the front and the back of the wiring member can be easily distinguished. Accordingly, it is possible to prevent incorrect assembling of the wiring member in the semiconductor module. In addition, since the upper surface portions 41 and 51 are portions that are not connected to the other portions, the upper surface portions 41 and 51 provide an advantage that the degree of freedom in design regarding the sizes and the positions of the projections 47 and 57 is high. In addition, since the projections 47 and 57 are integrated with the upper surface portions 41 and 51, the projections 47 and 57 can be easily made simultaneously with the other portions of the wiring members 4A, 4B, 5A, and 5B.

Embodiment 2

In embodiment 2, modifications of the above-described wiring members 4A, 4B, 5A, and 5B according to embodiment 1 will be described. The circuit configuration of a semiconductor module according to embodiment 2 is the same as that according to the above-described embodiment 1, and thus description thereof is omitted (see FIG. 1). The wiring members according to embodiment 2 can be used for, in addition to the semiconductor module 1 (see FIG. 2) including therein the H-bridge circuit, a semiconductor module including therein one phase of bridge circuit or a semiconductor module having another circuit configuration and including other components.

Figure 6:
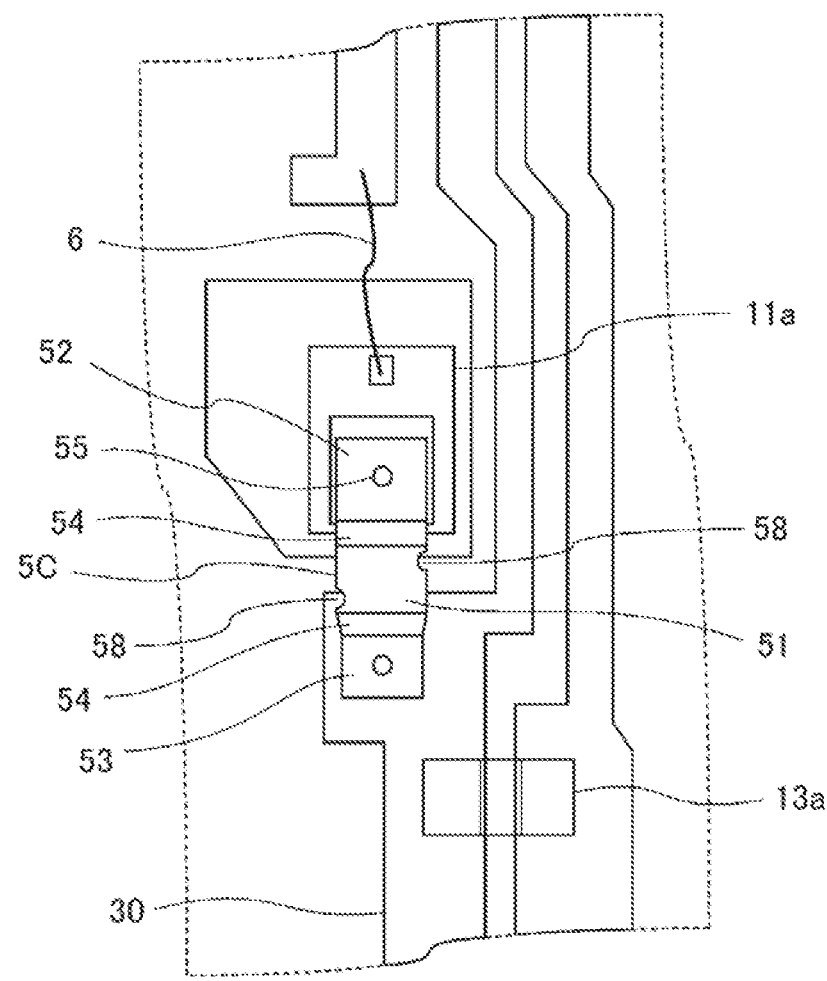
FIG. 6 is a top view of a wiring member according to embodiment 2.
Figure 7:
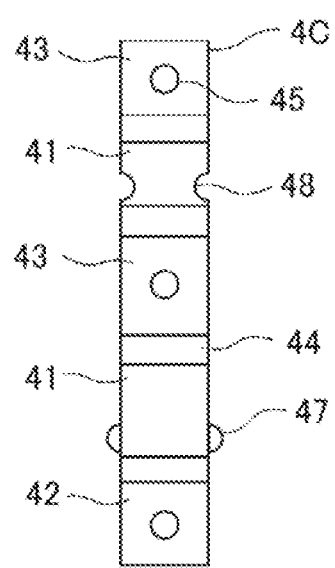
FIG. 7 is a top view of another wiring member according to embodiment 2.

FIG. 6 and FIG. 7 show the wiring members according to embodiment 2. Wiring members 5C and 4C according to embodiment 2 include the upper surface portions 51 and 41, the element connection portions 52 and 42, the plate connection portions 53 and 43, and the leg portions 54 and 44 in the same manner as the above-described wiring members 4A, 4B, 5A, and 5B according to embodiment 1. Each of the element connection portions 52 and 42 and the plate connection portions 53 and 43 has the through hole 45.

The wiring member 5C shown in FIG. 6 has recesses 58 in the upper surface portion 51 thereof. The recess 58 asymmetrically provided in both side surfaces of the upper surface portion 51 can be used for distinguishing the front and the back of the wiring member 5C. That is, since the positions of the two asymmetrically provided recesses 58 are switched with each other if the wiring member 5C is turned upside down, the front and the back can be distinguished based on the positions of the two recesses 58. Alternatively, if the recesses 58 are symmetrically provided in both side surfaces of the upper surface portion 51, the recesses 58 can be used also for distinguishing the orientation of the wiring member 5C.

Thus, the recesses 58 are used in the same manner as the projections 57 (see FIG. 5) of the wiring member 5A described in the above-described embodiment 1. Meanwhile, the recesses 58 may be used particularly in a case where the projections 57 easily come into contact with the wire bond 6 or another component or in a case where the projections 57 cause reduction in the stability of the wiring member. The shape of each recess 58 is not limited to the semicircular shape shown in FIG. 6, and may be a rectangular shape, a triangular shape, or the like. No special step is needed for forming the recesses 58, and the wiring member 5C having the recesses 58 can be produced by cutting a conductive plate so as to form the recesses 58 simultaneously with the other portions of the wiring member 5C and bending the conductive plate.

The wiring member 4C shown in FIG. 7 has projections 47 and recesses 48 at the upper surface portions 41 thereof. In the example shown in FIG. 7, a pair of projections 47 are symmetrically provided on both side surfaces of one of the upper surface portions 41, and a pair of recesses 48 are symmetrically provided in both side surfaces of the other upper surface portion 41. However, these pairs may be asymmetrically provided. Alternatively, each projection 47 and the corresponding recess 48 may form a pair, and the pair may be symmetrically or asymmetrically provided. In this manner, the projections 47 and the recesses 48 are disposed in various patterns, whereby, even in a semiconductor module having a complicated circuit configuration in which many types of wiring members are used, the type of each wiring member can be easily distinguished.

In each of the wiring members 5C and 4C according to embodiment 2, the recesses 58 or 48 are provided in the upper surface portion 51 or 41, whereby the type, the orientation, and the front and the back of the wiring member can be easily distinguished. Accordingly, it is possible to prevent incorrect assembling of the wiring member in the semiconductor module. Further, the projections 47 and the recesses 48 are disposed in combination, whereby more types of wiring members can be distinguished. In addition, since the upper surface portions 51 and 41 are portions that are not connected to the other portions, the upper surface portions 51 and 41 provide an advantage that the degree of freedom in design regarding the sizes and the positions of the recesses 58 and 48 is high.

Although the disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments of the disclosure. It is therefore understood that numerous modifications which have not been exemplified can be devised without departing from the scope of the specification of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS

1 semiconductor module
2 motor
3*a*, 3*b* power supply
4A, 4B, 4C, 5A, 5B, 5C wiring member
6 wire bond
7 mold resin
10*a*, 10*b*, 11*a*, 11*b*, 12*a* switching element
13*a*, 13*b* shunt resistor
30 plate
41, 51 upper surface portion
42, 52 element connection portion
43, 53 plate connection portion
44, 54 leg portion
45, 55 through hole
56 chamfer
47, 57 projection
48, 58 recess
100*a*, 100*b*, 101*a*, 101*b*, 102*a*, 102*b*, 103*a*, 103*b*, 104*a*, 104*b*, 105*a*, 105*b*, 106*a*, 107*a*, 107*b*, 108*a*, 108*b* terminal

The invention claimed is:

1. A wiring member for electrically connecting at least a first conduction portion and a second conduction portion to each other, the wiring member comprising:
    a first connection portion to be connected to the first conduction portion;
    a second connection portion to be connected to the second conduction portion;
    an upper surface portion disposed between the first connection portion and the second connection portion;
    a first leg portion disposed between one end of the upper surface portion and the first connection portion; and
    a second leg portion disposed between other end of the upper surface portion and the second connection portion,
    wherein the first connection portion, the second connection portion, the upper surface portion, the first leg portion, and the second leg portion are integrated with each other,
    wherein the upper surface portion has at least one from among projections and recesses, and
    wherein the at least one from among the projections and the recesses are asymmetrically provided to both side surfaces of the upper surface portion.

2. The wiring member according to claim 1, wherein the upper surface portion projects in a direction opposite to a direction toward: a connection surface, with the first conduction portion, of the first connection portion; and a connection surface, with the second conduction portion, of the second connection portion.

3. The wiring member according to claim 1, wherein the upper surface portion is provided in parallel to the first connection portion and the second connection portion.

4. The wiring member according to claim 1, wherein the first connection portion, the second connection portion, and the upper surface portion are at height positions different from one another.

5. The wiring member according to claim 3, wherein the first connection portion, the second connection portion, and the upper surface portion are at height positions different from one another.

6. The wiring member according to claim 1, wherein the first connection portion has a through hole formed in a direction perpendicular to a connection surface, with the first conduction portion, of the first connection portion.

7. The wiring member according to claim 1, wherein the second connection portion has a through hole formed in a direction perpendicular to a connection surface, with the second conduction portion, of the second connection portion.

8. The wiring member according to claim 1, wherein the upper surface portion has the projections which are integrated with the upper surface portion.

9. The wiring member according to claim 1, wherein a chamfer is formed at a corner of the first connection portion or the second connection portion.

10. A semiconductor module comprising:
    the wiring member according to claim 1;
    a plurality of semiconductor elements; and
    a plate which is made of metal and on which the plurality of semiconductor elements are mounted,
    wherein the first conduction portion is each semiconductor element, and the second conduction portion is the plate.

* * * * *